(12) United States Patent
Naito et al.

(10) Patent No.: US 6,285,699 B1
(45) Date of Patent: Sep. 4, 2001

(54) SEMICONDUCTOR LASER DEVICE (75) Inventors: Yumi Naito; Satoru Okada; Tsuyoshi Fujimoto, all of Sodegaura (JP)

(73) Assignee: Mitsui Chemicals Inc., Tokyo (JP)

( * ) Notice: Subject to any disclaimer, the term of this patent is extended or adjusted under 35 U.S.C. 154(b) by 0 days.

(21) Appl. No.: 09/163,395

(22) Filed: Sep. 30, 1998

(30) Foreign Application Priority Data

Sep. 30, 1997 (JP) .................................................. 9-266830

(51) Int. Cl.$^7$ ................................. H01S 5/00; H01S 3/08
(52) U.S. Cl. ................................................. 372/46; 372/96
(58) Field of Search ................................. 372/96, 46, 45

(56) References Cited

U.S. PATENT DOCUMENTS

| | | | |
|---|---|---|---|
| 4,769,822 | 9/1988 | Suyama et al. | 372/46 |
| 4,905,246 | * 2/1990 | Hayakawa et al. | 372/45 |
| 4,984,243 | * 1/1991 | Kagawa et al. | 372/46 |
| 5,297,158 | * 3/1994 | Naitou et al. | 372/46 |

FOREIGN PATENT DOCUMENTS

| | | |
|---|---|---|
| 0195425 | 9/1986 | (EP) . |
| 0256664 | 2/1988 | (EP) . |
| 0273730 | 7/1988 | (EP) . |
| 0390995A | 10/1990 | (EP) . |
| 60-066484A | 4/1985 | (JP) . |
| 3-238886 | * 10/1991 | (JP) . |

OTHER PUBLICATIONS

Martin et al., *IEEE Photonics Technology Letters*, vol. 7, No. 3, pp. 244–246, Mar. 1995.
Hashimoto, *Jpn. J. Appl. Phys.*, vol. 36, No. 5A, Part 1, pp. 2676–2680 (1997).
Imafuji et al., *IEEE Journal of Quantum Electronics*, vol. 29, No. 6, pp. 1889–1894 (Jun. 1993).
Patent Abstracts of Japan, E–687, p. 6, JP 63–178575 A, Jul. 22, 1988.
Patent Abstracts of Japan, E–949, p. 156, JP 2–105488 A, Apr. 18, 1990.

* cited by examiner

*Primary Examiner*—Quyen P. Leung
(74) *Attorney, Agent, or Firm*—Birch, Stewart, Kolasch & Birch, LLP

(57) ABSTRACT

On an n-GaAs substrate are sequentially formed an n-GaAs buffer layer, an n-AlGaAs cladding layer, a non-doped InGaAs active layer, a p-$Al_xGa_{1-x}$As cladding layer, a p-GaAs contact layer, and further an n-AlGaAs current blocking layer having a stripe-like window is embedded in the cladding layer. At the active layer side interface of the current blocking layer, a diffraction grating of cyclic bumps and dips shape is formed, but the diffraction grating is not formed in a region of the stripe-like window where the current blocking layer is not present, i.e., a current injection region. In this way, a semiconductor laser device of low oscillation threshold, high oscillation efficiency, high reliability, long life time, and stabilized oscillation wavelength can be realized.

10 Claims, 5 Drawing Sheets

SEMICONDUCTOR LASER DEVICE

BACKGROUND OF THE INVENTION

1. Field of the Invention

The present invention relates to a distributed feedback semiconductor laser device.

2. Description of the Related Art

Conventionally semiconductor lasers have been widely used as a light source for optical recording apparatuses, optical communications and pumping solid state lasers. Among the semiconductor lasers, the DFB (distributed feedback) type are provided with cyclic bumps and dips within an optical guide in the semiconductor laser to form a diffraction grating, whereby the wavelength is stabilized using a light feedback effect due to the diffraction grating. Because such a DFB laser oscillates in a stable single mode, no longitudinal mode hopping phenomenon caused with a change in temperature will occur and thus a mode hopping noise which is observed in a general Fabry-Perot semiconductor laser will not be generated. Therefore, the DFB laser is especially excellent as a light source of which a low high-frequency noise level is required. Furthermore, the DFB laser has such excellent features that changes in oscillation wavelength with changes in temperature are small and that the oscillation wavelength can be selected by varying a cycle of the diffraction grating, and accordingly it is suitable for light sources for optical communications or for pumping solid state lasers.

Figure 6A:
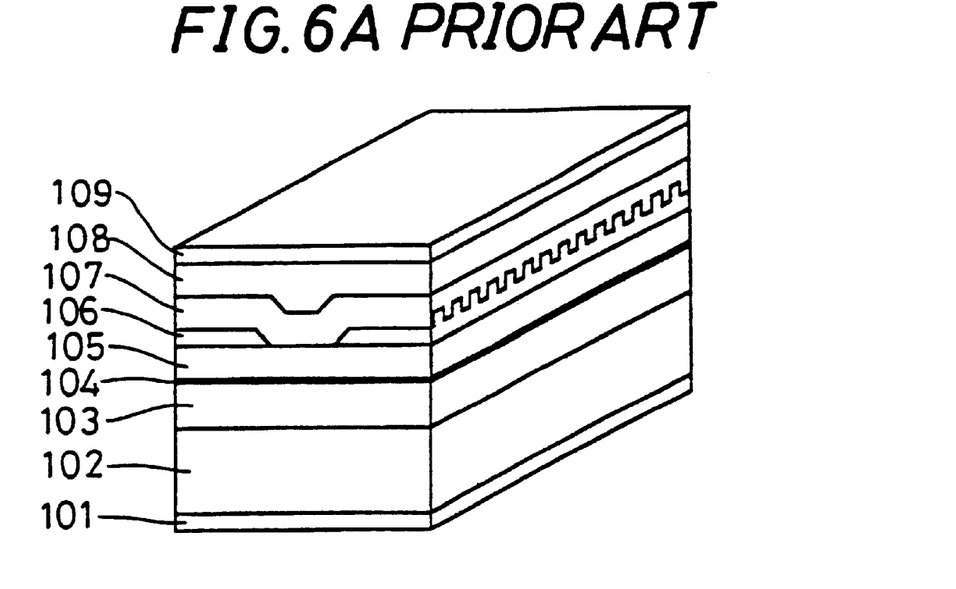
FIGS. 6A and 6B are views showing an example of a prior art semiconductor laser device of DFB laser type, which are a general perspective view and a partial perspective view showing a shape of the diffraction grating, respectively.
Figure 6B:
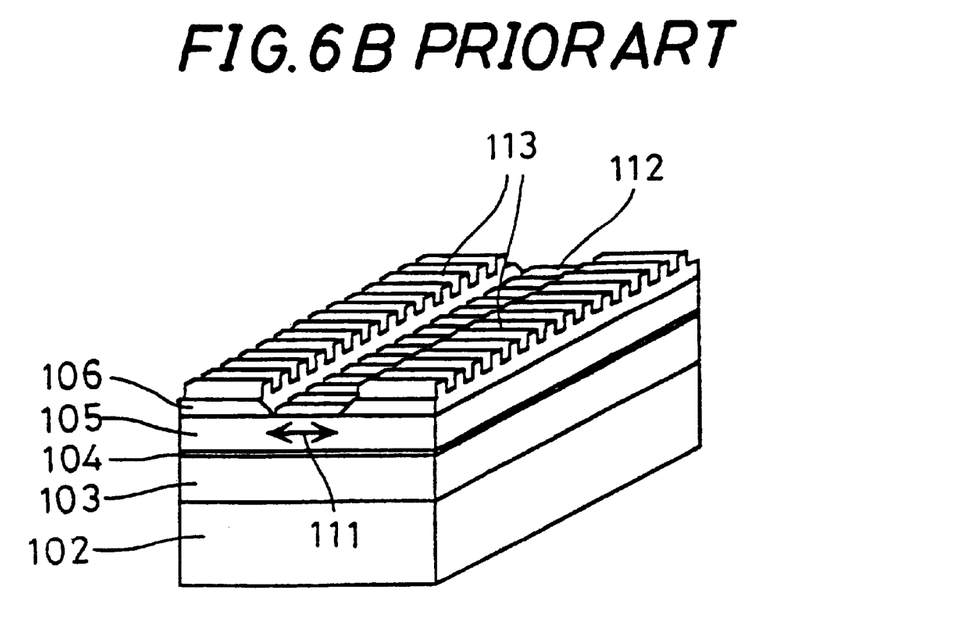

FIGS. 6 is a view showing an example of a conventional semiconductor laser device of DFB laser type. FIG. 6A is a general perspective view and FIG. 6B is a partial perspective view showing a shape of a diffraction grating. A semiconductor laser device of DFB laser type is described in Japanese Unexamined Patent Publication JP-A 60-66484 (1985), in which are sequentially formed an n-type (hereinafter, denoted by 'n-') $Al_{0.40}Ga_{0.60}As$ cladding layer 103, a non-doped $Al_{0.10}Ga_{0.90}As$ active layer 104, a p-type (hereinafter, denoted by 'p-') $Al_{0.25}Ga_{0.75}As$ optical guide layer 105, an n-GaAs current blocking layer 106 having a stripe-like window, a p-$Al_{0.40}Ga_{0.60}As$ cladding layer 107 and p-GaAs contact layer 108 on an n-GaAs substrate 102, and electrodes 101, 109 are respectively formed on the bottom face of the substrate 102 and the top surface of the contact layer 108.

As shown in FIG. 6B, diffraction gratings 112, 113 composed of cyclic bumps and dips are formed in a region 111 which is the bottom of the stripe-like window in the top face of the optical guide layer 105, and on the top surface of the current blocking layer 106, respectively. The cladding layer 107 is formed on the diffraction gratings 112, 113 so as to be embedded in the stripe-like window.

In a conventional semiconductor laser device of DFB laser type as shown in FIGS. 6A and 6B, electric current is injected into the active layer 104 through the stripe-like window of the current blocking layer 106. For this end, also in a bottom region, i.e. a current injection region of the stripe-like window of the optical guide layer 105 is formed a diffraction grating.

In processes for forming the diffraction grating such as etching, however, crystalline surfaces are exposed to the atmosphere, and as a result the substrate surface suffers oxidation, which causes many crystal defects. Therefore, in the structure as shown in FIGS. 6A and 6B, the crystal defects concentrate in the vicinity of right above the active layer 104, which forms a portion of poor crystal property.

In such a semiconductor laser, existing crystal defects trigger a further increasing tendency towards crystal defects during the operation, resulting in remarkable loss of life of the semiconductor laser. Furthermore, an increase in internal loss in the laser oscillator occurs and causes a problem of increase in oscillation threshold current or decrease in efficiency.

SUMMARY OF THE INVENTION

It is an object of the invention to provide a semiconductor laser device having a low oscillation threshold current, high oscillation efficiency, high reliability, long life time and stabilized oscillation wavelength.

The invention provides a self-aligned structure semiconductor laser device comprising:

an active layer;

a pair of cladding layers respectively formed on both faces of the active layer, the cladding layers having a band gap wider than that of the active layer; and a current blocking layer having a stripe-like window embedded in one of the cladding layers, wherein a diffraction grating for controlling an oscillation wavelength is formed on an interface of the current blocking layer or between the interface and the active layer excluding the stripe-like window.

According to the invention, a carrier is injected upon applying the voltage to the semiconductor laser, and the carrier is blocked by the current blocking layer in passing through the cladding layers. Consequently, the carrier passes through regions where the current blocking layer is not formed, i.e. only through the stripe-like grooves. The carrier injected into the active layer recombines to emit light, and as the injection current level is increased, induced emission starts and finally laser oscillation occurs. Part of the laser light is distributed into the bottom of the current blocking layer and is then guided.

At the bottom of the current blocking layer is formed a diffraction grating for stabilization of oscillation wavelength. Such types of diffraction gratings may be used that a) cyclic bumps and dips are formed at either or both of the lower and upper interfaces of the current blocking layer, b) a grating layer is formed between the active layer side interface of the current blocking layer and the active layer.

A cycle $\Lambda$ of the cyclic bumps and dips formed in the lower region of the current blocking layer, or a cycle $\Lambda$ of changes in width of the grating layer are set so as to meet the following equation (1).

$$\Lambda = m \cdot \lambda_0 / (2 \cdot nr) \tag{1}$$

wherein m is an integer of 1 or more (1, 2, 3, . . . ), nr is a refractive index of the optical guide path and $\lambda$ is an oscillation wavelength. When this grating condition is satisfied, light having the wavelength $\lambda$ is selected, so that a single mode oscillation can be realized.

Moreover, in the invention, since the diffraction grating is formed over the region excluding the stripe-like window and no diffraction grating is formed in the current injection region through which the current passes, there is no occurrence of crystal defects in this current injection region. Therefore, there is little possibility of problems of increase in oscillation threshold current and decrease in oscillation efficiency. Furthermore, it is possible to suppress the decrease in reliability due to growing of the crystal defects.

The invention provides a self-aligned structure semiconductor laser device comprising:

an active layer;

an optical guide layer formed on one face or a pair of optical guide layers on both faces of the active layer, respectively, the optical guide layer(s) having a band gap wider than that of the active layer;

a pair of cladding layers formed so as to sandwich the active layer and the optical guide layer(s) therebetween, the cladding layers having a band gap wider than that of the optical guide layer; and a current blocking layer having a stripe-like window embedded in at least one of the cladding layers;

wherein a diffraction grating for controlling an oscillation wavelength is formed on an interface of the current blocking layer or between the interface and the active layer excluding the stripe-like window.

According to the invention, since the optical guide layer is disposed on either or both of the faces of the active layer, the light generated in the active layer is guided by the optical guide layer. Consequently, concentration of the light in the active layer can be avoided and a high-power and long life-time laser is realized.

Furthermore, in the invention the diffraction grating is formed over the region excluding the stripe-like window and there exists no diffraction grating in the current injection region, crystal defects do not occur in the current injection region. Therefore, there is little possibility of problems of increase in oscillation threshold current and decrease in oscillation efficiency. Furthermore, it is possible to suppress the decrease in reliability due to growing of the crystal defects.

The invention provides a self-aligned structure semiconductor laser device comprising:

an active layer;

a pair of optical guide layers formed respectively on both faces of the active layer, the optical guide layers having a band gap wider than that of the active layer;

a pair of cladding layers formed so as to sandwich the active layer and the optical guide layers therebetween, the cladding layers having a band gap wider than that of the optical guide layers;

carrier blocking layers formed respectively between the active layer and the optical guide layers, the carrier blocking layers having a band gap wider than those of the active layer and the optical guide layers;

a current blocking layer having a stripe-like window embedded in at least one of the optical guide layers, wherein a diffraction grating for controlling an oscillation wavelength is formed on an interface of the current blocking layer or between the interface and the active layer excluding the stripe-like window.

According to the invention, a carrier (electron or hole) is injected upon applying a voltage to the semiconductor laser, and the carrier is blocked by the current blocking layer in passing through the optical guide layer. Consequently, the carrier passes through regions where the current blocking layer is not formed, i.e. only through the stripe-like grooves. The carrier injected into the active layer recombines to emit light, and as the injection current level is increased, induced emission starts and finally laser oscillation occurs. Part of the laser light is distributed into the bottom of the current blocking layer and is then guided. On the other hand, the carrier in the active layer is confined in the active layer because of the carrier blocking layer, resulting in enhancement of recombination efficiency of the carrier improves.

At the bottom of the current blocking layer is formed a diffraction grating for stabilization of oscillation wavelength. The diffraction grating may be of such types that a) cyclic bumps and dips are formed at one or both of the lower and upper interfaces of the current blocking layer, b) a grating layer is formed between the active layer side interface of the current blocking layer and the active layer. When the cycle $\Lambda$ of the cyclic bumps and dips or the cycle $\Lambda$ at which the width of the grating layer varies is set so as to satisfy the above equation (1), a single mode oscillation is obtained.

Moreover, according to the invention, since the diffraction grating is formed only over regions excluding the stripe-like window and there is no diffraction grating in the current injection region through which the current passes, crystal defects do not occur in the current injection region. Therefore, the possibility of causing problems such as increase in oscillation threshold current and decrease in oscillation efficiency is minimized. Furthermore, decrease in reliability due to growing of the crystal defects can be suppressed.

As described above, providing the carrier blocking layer between the active layer and the optical guide layer makes it possible to freely design the optical guide system in the device independently of the confinement of the carrier into the active layer, and therefore it is possible to bring the wave guide mode close to an ideal Gaussian shape by employing a wide optical guide layer. This allows a widespread selection of refractive index and thickness of the diffraction grating, so it is possible to increase the degree of freedom in design, widen the production margin and improve the production yield of the semiconductor laser. On the contrary, in the case where the carrier blocking layer is not formed between the active layer and the optical guide layer, the wave guide mode becomes Mt. Fuji type mode having a sharp peak. However, in the case where the carrier blocking layer is provided between the active layer and the optical guide layer, the wave guide mode becomes the Gaussian shape mode whose shoulders slightly jut out as compared with the Mt. Fuji shape mode, and in which mode, changes in electric field intensity become more gentle in regions having a higher electric field intensity. Therefore, in the semiconductor laser having a Gaussian shaped guide mode, even when the diffraction grating for controlling the wavelength is formed in a position distant from the active layer, the diffraction grating sufficiently effects. And moreover, even if the distance between the active layer and the diffraction grating or the refractive index distribution is changed in some degree during the production process, the influence by the change is suppressed because of the gentle change of electric field intensity, resulting in an improved production yield.

In the invention a semiconductor material for forming the optical guide layer is preferably GaAs or AlGaAs having an Al composition of 0.3 or less, InGaP or InGaAsP.

According to the invention, in the process of forming a diffraction grating for stabilization of the oscillation wavelength, the optical guide layer to be exposed to the atmosphere is formed of a material which is hardly deteriorated by oxidation, or a material having low Al composition or containing no aluminum. As a result, oxidation is suppressed on surfaces to be exposed to the atmosphere in the stripe-like window or the region where the diffraction grating is to be formed. Therefore, the crystal property of each re-growing layer improves, and a semiconductor laser of high reliability is obtained. Each element of InGaP or InGaAsP may have any composition insofar as it can lattice-matching with the substrate.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENT

Now referring to the drawings, preferred embodiments of the invention are described below.

In the following embodiments, a diffraction grating is prepared in any case by etching a layer forming the diffraction grating using as a mask a resist in which a grating is formed by the well-known interfering exposure method. More specifically, the method comprises the steps of growing a layer in which the diffraction grating is to be formed, thereafter applying the resist, exposing the resist in a grating shape by interference exposure of laser light, developing the resist, etching a layer under the resist to a predetermined depth using the resist as a mask, removing the mask of the resist, then re-growing the upper layer. During the steps, the layer forming the diffraction grating is exposed to the atmosphere.

Embodiment 1

Figure 1A:
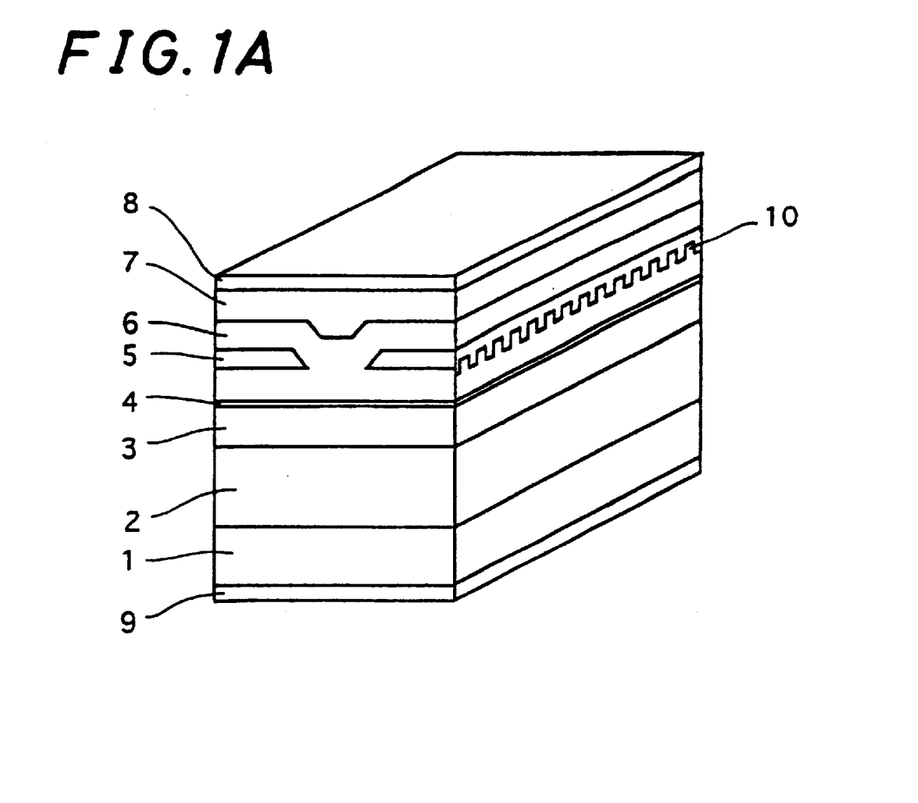
FIGS. 1A and 1B are views showing a first embodiment of the invention, which are a general perspective view and a partial perspective view showing a shape of a diffraction grating, respectively.
Figure 1B:
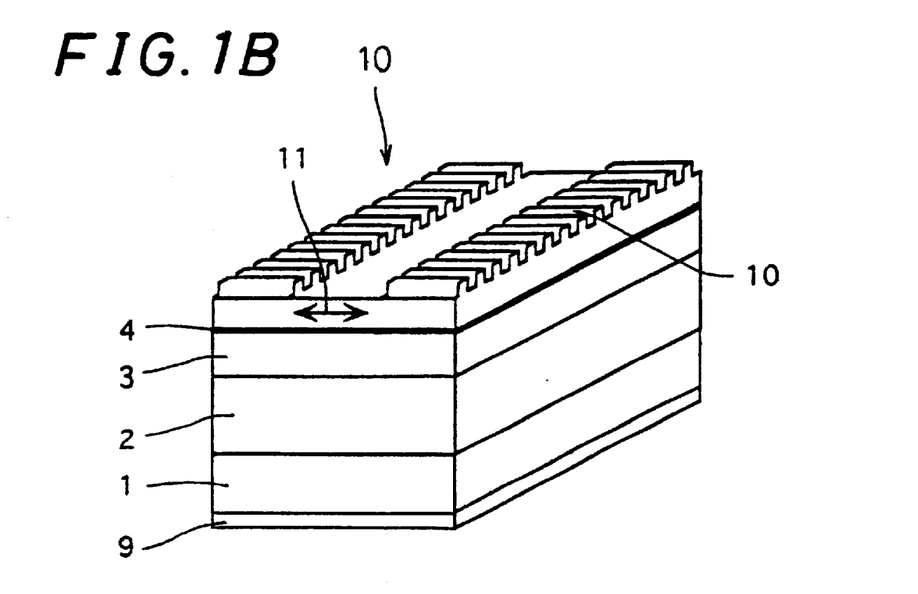

FIGS. 1A and 1B are views showing a first embodiment of the invention, which are a general perspective view and a partial perspective view showing a shape of a diffraction grating, respectively. This semiconductor laser device is constituted as one of DFB laser type, in which are sequentially formed a buffer layer 2 of n-GaAs (thickness t=0.5 $\mu$m), a cladding layer 3 of n-AlGaAs (Al composition ratio x=0.4, t=1.5 $\mu$m), a double quantum well active layer 4 composed of a non-doped GaAs well layer (t=0.008 $\mu$m) / a non-doped AlGaAs barrier layer (x=0.2, t=0.005 $\mu$m), a cladding layer 6 of p-AlGaAs (x=0.4, t=1.6 $\mu$m), and a contact layer 7 of p-GaAs (t=1.0 $\mu$m) on a substrate 1 of n-GaAs by using the MOCVD (Metal Organic Chemical Vapor Deposition) method or the like, and a current blocking layer 5 of n-AlGaAs (x=0.5, t=0.1 $\mu$m) having a stripe-like window is embedded in the cladding layer 6. On the bottom face of the substrate 1 and the top face of the contact layer 7, electrodes 8 and 9 are respectively formed.

In the AlGaAs materials, as the Al composition is higher, the band gap tends to become wider. In the embodiment, the band gap of the cladding layers is wider than that of the active layer 4.

As shown in FIG. 1B, a diffraction grating 10 composed of cyclic bumps and dips is formed at the active layer side interface of the current blocking layer 5, and there is no diffraction grating at a stripe-like window 11 where the current blocking layer 5 is not present, i.e. a current injection region. On the 13 diffraction grating 10, the current blocking layer 5 is formed, and then the cladding layer 6 is formed so as to be embeded in the window 11.

Next, the operation of the semiconductor laser device will be described. Upon applying a positive bias voltage to the electrode 8 of the contact layer 7 and a negative bias voltage to the electrode 9 of the substrate, an electric current flows from the contact layer 7 to the substrate 1, and passes through only a region where the current blocking layer 5 is not formed, i.e., through the stripe-like window 11, whereby the electric current density is increased.

The electric current is injected into the active layer 4 as a carrier, and then the carrier re-combines to emit light. Further, as the injection amount of current increases, induced emission starts and finally laser oscillation occurs. Part of the laser light is distributed through the cladding layers 3, 6 disposed on both faces of the active layer 4, further into the bottom of the current blocking layer 5, and is then guided.

By setting a cycle $\Lambda$ of the diffraction grating 10 so as to satisfy the equation (1), only the wavelength $\lambda_0$ oscillates selectively, so that a single-mode oscillation is achieved. In this device, deterioration in crystal property is not caused in the current injection region or the window 11, so that a DFB semiconductor laser of low oscillation threshold, high efficiency and long life time is realized.

Embodiment 2

Figure 2:
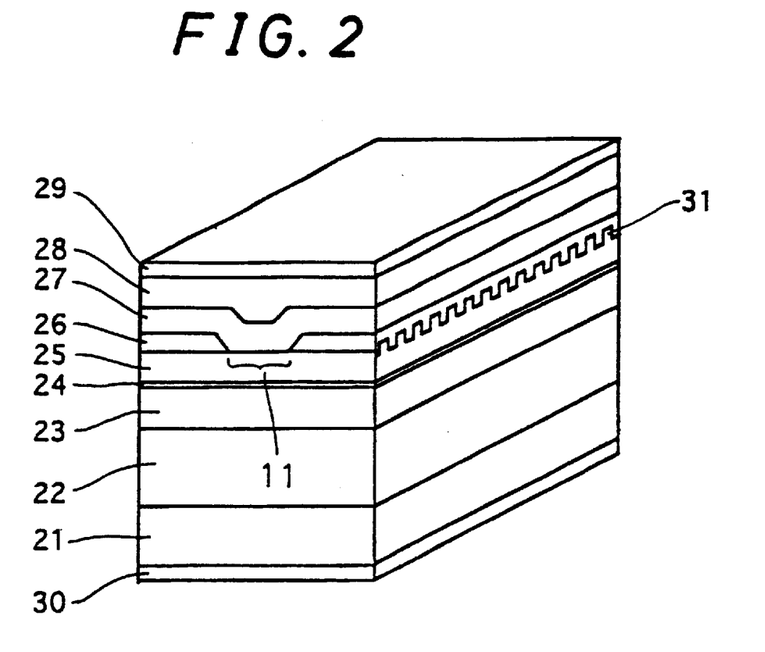
FIG. 2 is a perspective view of a second embodiment of the invention.

FIG. 2 is a perspective view showing a second embodiment of the invention. This semiconductor laser device is constituted as one of DFB laser type, in which are sequentially formed a buffer layer 22 of n-GaAs (thickness t=0.5 $\mu$m), a cladding layer 23 of n-AlGaAs (Al composition ratio x=0.45, t=1.5 $\mu$m), a double quantum well active layer 24 composed of a non-doped AlGaAs well layer (x=0.1, t=0.006 $\mu$m) / an AlGaAs barrier layer (x=0.3, t=0.005 $\mu$m), a first cladding layer 25 of p-AlGaAs (x=0.3, t=0.15 $\mu$m), a second cladding layer 27 of p-AlGaAs (x=0.55, t=1.0 $\mu$m) and a contact layer 28 of p-GaAs on a substrate 21 of n-GaAs by using the MOCVD method or the like, and a current blocking layer 26 of n-AlGaAs (x=0.58, t=0.1 $\mu$m) having a stripe-like window is embedded between the first cladding layer 25 and the second cladding layer 27. On the bottom face of the substrate 21 and the top face of the contact layer 28, electrodes 30 and 29 are respectively formed.

In the above constitution, the first cladding layer 25 functions as the optical guide layer for guiding the light generated in the active layer 24. Moreover, the band gaps of AlGaAs materials tend to become wider as the Al composition is higher. In this embodiment, the band gap of the first cladding layer 25 is wider than that of the active layer 24, and the band gaps of the lower cladding layer 23 and the upper second cladding layer 27 are wider than that of the first cladding layer 25.

A diffraction grating 31 composed of cyclic bumps and dips is formed at an active layer side interface of the current blocking layer 26, but the diffraction grating is not formed in the stripe-like window 11 where the current blocking layer 26 is not present, i.e. in the current injection region.

Next, the operation of the above semiconductor laser device will be described. Upon applying a positive bias voltage to the electrode 29 of the contact layer 28 and a negative bias voltage to the electrode 30 of the substrate 21, an electric current flows from the contact layer 28 to the substrate 21, and passes through only a region where the current blocking layer 26 is not present, i.e., through the stripe-like window 11, whereby the electric current density is increased.

The electric current is injected into the active layer 24 as a carrier, and the carrier then re-combines to emit light. Further, as the amount of injection current increases, induced emission starts and finally laser oscillation occurs. Part of the laser light is distributed through the cladding layer 23 and first cladding layer 25 on both faces of the active layer 24, and further into the bottom of the current blocking layer 26, and is then guided.

By setting the cycle $\Lambda$ of the diffraction grating 10 so as to satisfy the equation (1), only the wavelength $\lambda_0$ oscillates selectively, so that a single-mode oscillation is achieved. In this device, deterioration in crystal property is not caused in the current injection region or the window 11, so that a DFB semiconductor laser of low oscillation threshold, high efficiency and long life time is realized.

Embodiment 3

Figure 3:
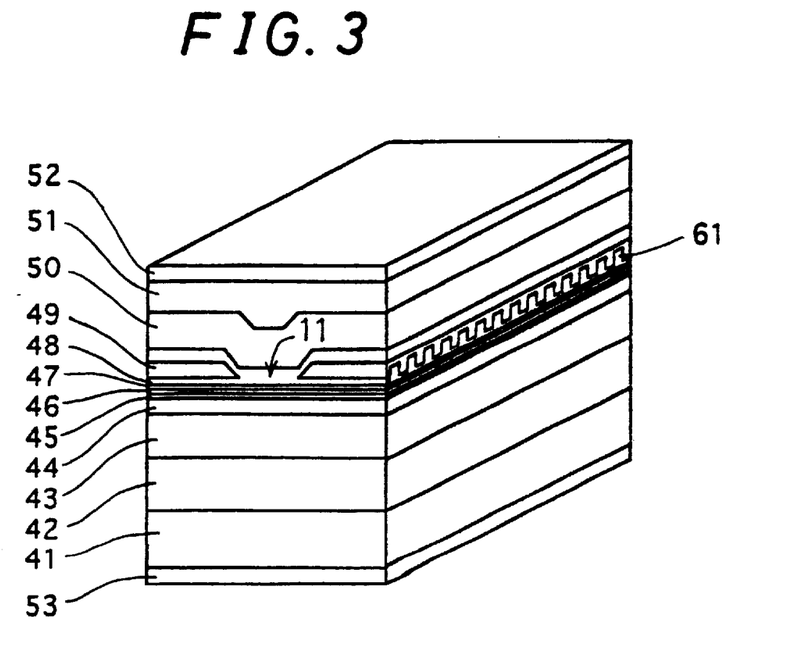
FIG. 3 is a perspective view of a third embodiment of the invention.

FIG. 3 is a perspective view showing a third embodiment of the invention. This semiconductor laser device is constituted as one of DFB laser type, in which are sequentially formed a buffer layer 42 of n-GaAs (thickness t=0.5 $\mu$m), a cladding layer 43 of n-AlGaAs (Al composition ratio x=0.24, t=1.1 $\mu$m), an optical guide layer 44 of n-AlGaAs (x=0.2, t=0.88 $\mu$m), a carrier blocking layer 45 of n-AlGaAs (x=0.5, t=0.02 $\mu$m), a double quantum well active layer 46 composed of a non-doped InGaAs well layer (In composition ratio y=0.2, t=0.008 $\mu$m) / a non-doped AlGaAs barrier layer (Al composition ratio x=0.2, t=0.006 $\mu$m), a carrier blocking layer 47 of p-AlGaAs (x=0.5, t=0.02 $\mu$m), an optical guide layer 48 of p-AlGaAs (x=0.2, t=0.88 $\mu$m), a cladding layer 50 of p-AlGaAs (x=0.24, t=1.1 $\mu$m) and a contact layer 51 of p-GaAs on a substrate 41 of n-GaAs by using the MOCVD method or the like, and a current blocking layer 49 of n-AlGaAs (x=0.33, t=0.1 $\mu$m) having a stripe-like window is embedded in the optical guide layer 48. On the bottom face of the substrate 41 and the top face of the contact layer 51 are formed electrodes 53 and 52, respectively.

The band gaps of AlGaAs materials are wider than those of InGaAs materials and tend to become wider as the Al composition is higher. In this embodiment, the band gaps of the optical guide layers 44, 48 are wider than that of the active layer 46, the band gaps of the cladding layers 43, 50 are wider than those of the optical guide layers 44, 48, and the band gaps of the carrier blocking layers 45, 47 are wider than those of the optical guide layers 44, 48.

A diffraction grating 31 composed of cyclic bumps and dips is formed at an active layer side interface of the current blocking layer 49, but the diffraction grating is not formed in the stripe-like window 11 where the current blocking layer 49 is not present, i.e. in the current injection region.

Next, the operation of the above semiconductor laser device will be described. Upon applying a positive bias voltage to the electrode 52 of the contact layer 51 and a negative bias voltage to the electrode 53 of the substrate 41, an electric current starts flowing from the contact layer 51 to the substrate 41, and passes only through the region where the current blocking layer 49 is not present, i.e., through the stripe-like window 11, whereby the electric current density is increased.

The electric current is injected into the active layer 46 as a carrier, and the carrier then re-combines to emit light. Further, as the injection amount of current increases, stimulated emission starts and finally laser oscillation occurs. Part of the laser is distributed through the optical guide layers 44, 48 disposed on both faces of the active layer 46, and further into the bottom of the current blocking layer 49, and is then guided. Since the carrier within the active layer 46 is confined in the active layer because of the carrier blocking layers 45, 47, re-combination efficiency of the carrier is improved.

By setting the cycle $\Lambda$ of the diffraction grating 10 so as to satisfy the equation (1), only the wavelength $\lambda_0$ oscillates selectively, so that a single-mode oscillation is achieved. In this device, deterioration in crystal property is not caused in the current injection region or the window 11, so that a DFB semiconductor laser of low oscillation threshold, high efficiency and long life time is realized.

Though in this embodiment is described the case where the diffraction grating 61 is formed at the active layer side interface of the current blocking layer 49 in this embodiment, the diffraction grating may be formed at the contact layer side interface of the current blocking layer 49 in the same manner.

Embodiment 4

Figure 4A:
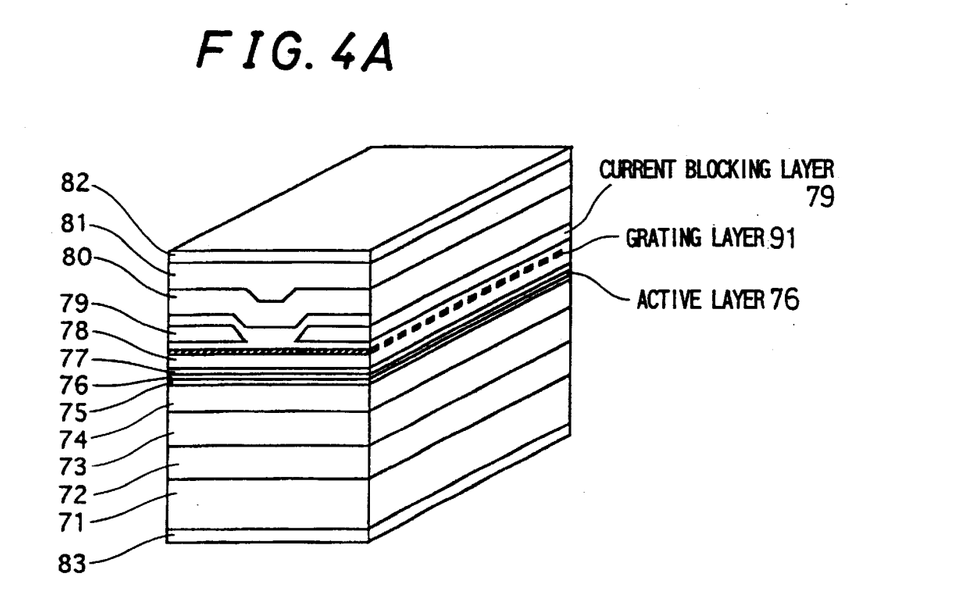
FIGS. 4A and 4B are views showing a fourth embodiment of the invention, which are a general perspective view and a partial perspective view showing a shape of a diffraction grating, respectively.
Figure 4B:
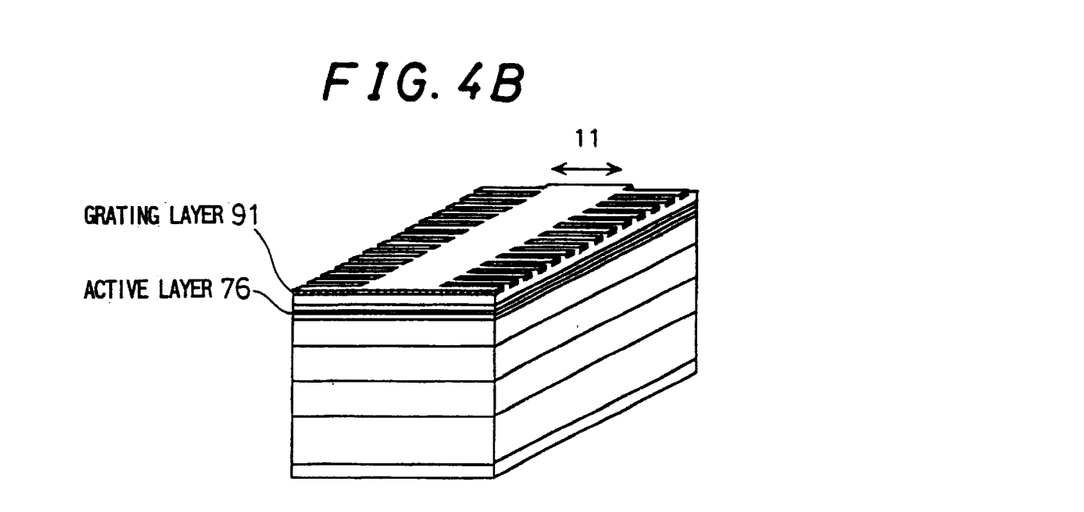

FIGS. 4A and 4B are views showing a fourth embodiment of the invention, which are a general perspective view and a partial perspective view showing a shape of a diffraction grating, respectively. This semiconductor laser device is constituted as one of DFB laser type, in which are sequentially formed a buffer layer 72 of n-GaAs (thickness t=0.5 $\mu$m), a cladding layer 73 of n-AlGaAs (Al composition ratio x=0.24, t=1.1 $\mu$m), an optical guide layer 74 of n-AlGaAs (x=0.2, t=0.83 $\mu$m), a carrier blocking layer 75 of n-AlGaAs (x=0.5, t=0.02 $\mu$m), a double quantum well active layer 76 composed of a non-doped InGaAs well layer (In composition ratio y=0.2, t=0.008 $\mu$m) / a non-doped AlGaAs barrier layer (Al composition ratio x=0.2, t=0.006 $\mu$m), a carrier blocking layer 77 of p-AlGaAs (x=0.5, t=0.02 $\mu$m), an optical guide layer 78 of p-AlGaAs (x=0.2, t=0.83 $\mu$m), a cladding layer 80 of p-AlGaAs (x=0.24, t=1.1 $\mu$m) and a contact layer 81 of p-GaAs on a substrate 71 of n-GaAs by using the MOCVD method or the like, and a current blocking layer 79 of n-AlGaAs (x=0.24, t=0.1 $\mu$m) having a stripe-like window is embedded in the optical guide layer 78. On the bottom face of the substrate 71 and the top face of the contact layer 81 are formed electrodes 83 and 82, respectively.

The band gaps of AlGaAs materials are wider than those of InGaAs materials and tend to become wider as the Al composition is higher. In this embodiment, the band gaps of the optical guide layers 74, 78 are wider than that of the active layer 76, the band gaps of the cladding layers 73, 80 are wider than those of the optical guide layers 74, 78, and the band gaps of the carrier blocking layers 75, 77 are wider than those of the optical guide layers 74, 78.

Furthermore, in place of the diffraction grating 61 for controlling the wavelength shown in FIG. 3, a grating layer 91 having the same function is provided in this embodiment.

The grating layer 91 is formed by patterning p-GaAs (thickness t=0.05 $\mu$m) in a cyclic manner in the optical guide layer 78. The grating layer 91 is disposed between the active layer side interface of the current blocking layer 79 and the active layer 76, and is formed to have a uniform thickness in a region of the window 11 and to be cyclic bumps and dips in regions of both sides of the window 11, thereby acting as a diffraction grating of the cycle $\Lambda$. By setting the cycle $\Lambda$ of the diffraction grating 10 so as to satisfy the equation (1), only the wavelength $\lambda_0$ oscillates selectively, so that a single-mode oscillation is achieved. In this device, deterioration in crystal property is not caused in the current injection region or the window 11, so that a DFB semiconductor laser of low oscillation threshold, high efficiency and long life time is realized.

Embodiment 5

Figure 5A:
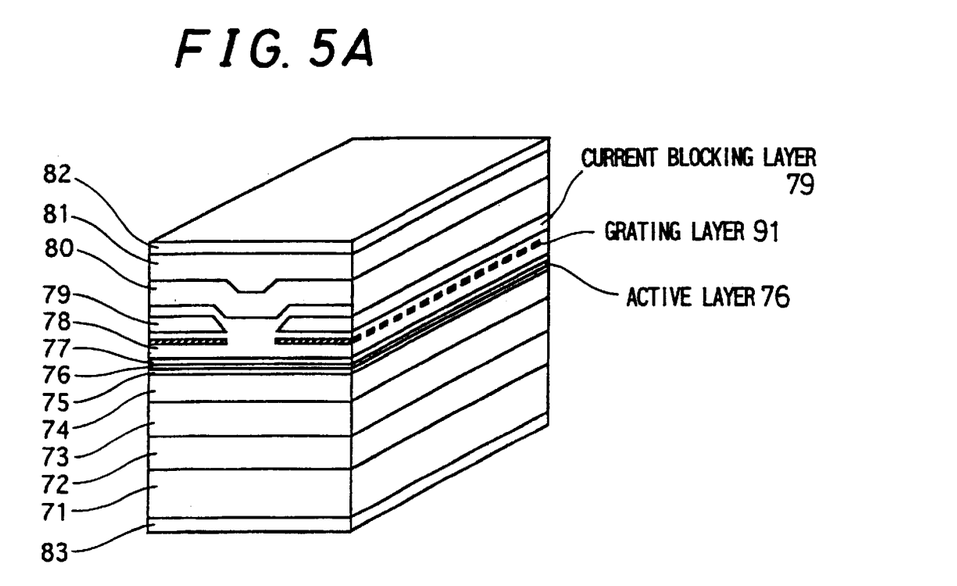
FIGS. 5A and 5B are views showing a fifth embodiment of the invention, which are a general perspective view and a partial perspective view showing a shape of a diffraction grating, respectively.
Figure 5B:
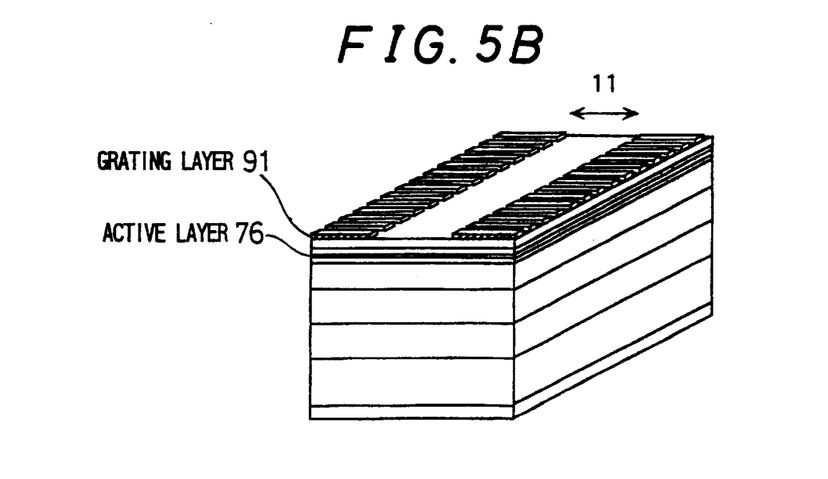

FIGS. 5A and 5B are views showing a fifth embodiment of the invention, which are a general perspective view and a partial perspective view showing a shape of a diffraction grating, respectively. This semiconductor laser device is constituted as one of DFB laser type, in which are sequentially formed a buffer layer 72 of n-GaAs (thickness t=0.5 μm), a cladding layer 73 of n-AlGaAs (Al composition ratio x=0.24, t=1.1 μm), an optical guide layer 74 of n-AlGaAs (x=0.2, t=0.83 μm), a carrier blocking layer 75 of n-AlGaAs (x=0.5, t=0.02 μm), a double quantum well active layer 76 composed of a non-doped InGaAs well layer (In composition ratio y=0.2, t=0.008 μm) / a non-doped AlGaAs barrier layer (Al composition ratio x=0.2, t=0.006 μm), a carrier blocking layer 77 of p-AlGaAs (x=0.5, t=0.02 μm), an optical guide layer 78 of p-AlGaAs (x=0.2, t=0.83 μm), a cladding layer 80 of p-AlGaAs (x=0.24, t=1.1 μm) and a contact layer 81 of p-GaAs on a substrate 71 of n-GaAs by using the MOCVD method or the like, and a current blocking layer 79 of n-AlGaAs (x=0.24, t=0.1 μm) having a stripe-like window is embedded in the optical guide layer 78. On the bottom face of the substrate 71 and the top face of the contact layer 81 are formed electrodes 83 and 82, respectively.

The band gaps of AlGaAs materials are wider than those of InGaAs materials and tend to become wider as the Al composition is higher. In this embodiment, the band gaps of the optical guide layers 74, 78 are wider than that of the active layer 76, the band gaps of the cladding layers 73, 80 are wider than those of the optical guide layers 74, 78, and the band gaps of the carrier blocking layers 75, 77 are wider than those of the optical guide layers 74, 78.

Furthermore, in this embodiment a grating layer 91 having the same function is provided in place of the diffraction grating 61 for controlling the wavelength as shown in FIG. 3.

The grating layer 91 is formed by patterning p-GaAs (thickness t=0.05 μm) in a cyclic manner in the optical guide layer 78. The grating layer 91 is located between the active layer side interface of the current blocking layer 79 and the active layer 76, and formed to be cyclic bumps and dips in regions of both sides of the window 11, thereby acting as a diffraction grating of the cycle Λ. The grating layer 91 is not formed in the region of the window 11. As a method of forming the grating layer in the regions of both sides of the window 11, a method of using the selective growth of the grating layer or a method including the steps of growing the grating layer in a whole region including the window and removing the window part of the grating layer by etching may be exemplified.

By setting this cycle Λ so as to satisfy the equation (1), only the wavelength $\lambda_0$ oscillates selectively, so that a single-mode oscillation is achieved. In this device, the grating layer 91 is absent in the region of the window 11 which is a current injection region, and the stripe-like window 11 lacks a layer having a different refractive index, which brings an advantage that the optical mode of the oscillating laser light is not disturbed.

Though the guide layers are formed of AlGaAs in the above embodiments, these guide layers are preferably formed of materials containing little or no aluminum such as InGaP, InGaAsP, or AlGaAs (Al composition x: $0 \leq x \leq 0.3$) in these structures. The guide layer having such a composition improves the effect of suppressing damages due to oxidation during formation of the diffraction grating, which allows higher reliability.

The invention may be embodied in other specific forms without departing from the spirit or essential characteristics thereof. The present embodiments are therefore to be considered in all respect as illustrative and not restrictive, the scope of the invention being indicated by the appended claims rather than by the foregoing description and all changes which come within the meaning and the range of equivalency of the claims are therefore intended to be embraced therein.

What is claimed is:

1. A self-aligned structure semiconductor laser device comprising:

an active layer;

a pair of cladding layers respectively formed on both faces of the active layer, the cladding layers having a band gap wider than that of the active layer; and a current blocking layer having a band gap wider than that of the active layer and a stripe-like window embedded in one of the cladding layers, wherein a diffraction grating for controlling an oscillation wavelength is formed on an interface of the current blocking layer and the cladding layer in which the current blocking layer is embedded or between the current blocking layer and the active layer excluding the stripe-like window.

2. The semiconductor laser device of claim 1, wherein the diffraction grating meets the following equation:

$$\Lambda = m \cdot \lambda_0 / (2 \cdot nr)$$

where Λ is a cycle of changes in the width of the diffraction grating, m is an integer of 1 or more, nr is a refractive index of an optical guide path, and $\lambda_0$ is an oscillation wavelength.

3. A self-aligned structure semiconductor laser device comprising:

an active layer;

an optical guide layer formed on one face or a pair of optical guide layers on both faces of the active layer, respectively, the optical guide layer(s) having a band gap wider than that of the active layer;

a pair of cladding layers formed so as to sandwich the active layer and the optical guide layer(s) therebetween, the cladding layers having a band gap wider than that of the optical guide layer; and a current blocking layer having a band gap wider than that of the active layer and a stripe-like window embedded in at least one of the cladding layers;

wherein a diffraction grating for controlling an oscillation wavelength is formed on an interface of the current blocking layer and the cladding layer in which the current blocking layer is embedded or between the current blocking layer and the active layer excluding the stripe-like window.

4. The semiconductor laser device of claim 3, wherein a semiconductor material for forming the optical guide layer is GaAs or AlGaAs having an Al composition of 0.3 or less, InGaP or InGaAsP.

5. The semiconductor laser device of claim 3, wherein the diffraction grating meets the following equation:

$$\Lambda = m \cdot \lambda_0 / (2 \cdot nr)$$

where $\Lambda$ is a cycle of changes in the width of the diffraction grating, m is an integer of 1 or more, nr is a refractive index of an optical guide path, and $\lambda_0$ is an oscillation wavelength.

6. The semiconductor laser device of claim 3, wherein the optical guide layer has a thickness of 0.88 μm and comprises p-AlGaAs having 0.2 Al.

7. A self-aligned structure semiconductor laser device comprising:
   an active layer;
   a pair of optical guide layers formed respectively on both faces of the active layer, the optical guide layers having a band gap wider than that of the active layer;
   a pair of cladding layers formed so as to sandwich the active layer and the optical guide layers therebetween, the cladding layers having a band gap wider than that of the optical guide layers;
   carrier blocking layers formed respectively between the active layer and the optical guide layers, the carrier blocking layers having a band gap wider than those of the active layer and the optical guide layers;
   a current blocking layer having a band gap wider than that of the active layer and a stripe-like window embedded in at least one of the optical guide layers,
   wherein a diffraction grating for controlling an oscillation wavelength is formed on an interface of the current blocking layer and the optical guide layer in which the current blocking layer is embedded or between the current blocking layer and the active layer excluding the stripe-like window.

8. The semiconductor laser device of claim 7, wherein a semiconductor material for forming the optical guide layer is GaAs or AlGaAs having an Al composition of 0.3 or less, InGaP or InGaAsP.

9. The semiconductor laser device of claim 7, wherein the diffraction grating meets the following equation:

$$\Lambda = m \cdot \lambda_0 / (2 \cdot nr)$$

where $\Lambda$ is a cycle of changes in the width of the diffraction grating, m is an integer of 1 or more, nr is a refractive index of an optical guide path, and $\lambda_0$ is an oscillation wavelength.

10. The semiconductor laser device of claim 7, wherein one of the pair of optical guide layers has a thickness of 0.83 μm and comprises n-AlGaAs having 0.2 Al, and a second of the pair of optical guide layers has a thickness of 0.83 μm and comprises p-AlGaAs having 0.2 Al.

* * * * *